United States Patent [19]

Adler

[11] Patent Number: 4,587,430

[45] Date of Patent: May 6, 1986

[54] ION IMPLANTATION SOURCE AND DEVICE

[75] Inventor: Richard J. Adler, Albuquerque, N. Mex.

[73] Assignee: Mission Research Corporation, Santa Barbara, Calif.

[21] Appl. No.: 465,655

[22] Filed: Feb. 10, 1983

[51] Int. Cl.[4] ............................................. H01J 27/00
[52] U.S. Cl. ............................. 250/423 R; 250/492.2
[58] Field of Search ............... 250/423 R, 426, 492.2; 315/111.81; 313/359.1, 361.1, 363.1

[56] References Cited

U.S. PATENT DOCUMENTS

| | | | |
|---|---|---|---|
| 2,806,161 | 9/1957 | Foster | 250/426 |
| 2,934,665 | 4/1960 | Ziegler | 250/426 |
| 3,137,801 | 6/1964 | Brooks et al. | 250/423 |
| 3,569,756 | 3/1971 | Reifenschweiler | 250/426 |
| 3,890,535 | 6/1975 | Gautherin | 250/423 |
| 4,045,677 | 8/1977 | Humphries et al. | 250/423 R |
| 4,126,806 | 11/1978 | Kapetanakos | 250/423 R |
| 4,194,139 | 3/1980 | Pasour et al. | 250/423 R |
| 4,370,176 | 1/1983 | Bruel | 250/492.2 |
| 4,388,560 | 6/1983 | Robinson et al. | 250/423 R |

Primary Examiner—Alfred E. Smith
Assistant Examiner—R. Hanig
Attorney, Agent, or Firm—Donald D. Mon; David O'Reilly

[57] ABSTRACT

Ion implantation devices in which the ion source is comprised of one or more vacuum spark gaps arranged to create a plasma and manipulated using magnetic fields are described. Each spark gap is comprised of a point electrode and a surface electrode with the plasma being generated from the surface electrode when a spark is initiated across the gap. A plurality of these spark gaps are coupled to a magnetically insulated ion diode. The spark gaps are arrayed around the azimuth of the ion diode so that plasma flows in and out of the diode along the lines of the magnetic field. The method of arraying the gaps results in an efficient, controllable, high density manner with extended pulse length. A second embodiment of these principles results in an advantageous implantation source using permanent magnets rather than grids. The spark gaps permit ion source versatility in that a wide variety of solid surfaces can be used as ion sources.

22 Claims, 8 Drawing Figures

ION IMPLANTATION SOURCE AND DEVICE

FIELD OF THE INVENTION

This invention relates to implantation of ions in surfaces, using a spark in a magnetic field in a vacuum as a source of ions.

BACKGROUND OF THE INVENTION

Implantation of ions in a surface is a known process. It enables the properties of a surface to be improved by imparting to it characteristics derived from the implanted material. Thus, corrosion resistance and bearing properties, for example, can be improved. Because the improvement is imparted only to the surface, the penetration need not be especially deep for good results to be attained. Only very small quantities of implanted materials need be used, and for this reason materials having optimum properties can be utilized, even though their cost is so high that they could not be afforded in such larger quantities as would be required if they were alloyed with the basic material to a substantial depth. This implantation process thereby enables high cost surfaces to be provided on products at low cost, thereby importantly improving the worth of relatively inexpensive parts.

Ion implantation as a process is widely used in the semi-conductor industry. However, the processing equipment is itself so costly that the process using it is not economically useful generally in industry, except where cost is not a real problem or objection. Surface treatment of helicopter main rotor bearings is an example of an application outside of the semi-conductor industry where the issue of man-safety outweighs any economic objection.

With relatively few exceptions, even medium-cost technology cannot economically enjoy the benefits of ion implantation with the use of existing equipment.

Furthermore, existing techniques are limited in the range and selection of materials which can be made available for ion implantation.

It is an object of this invention to provide elegantly simple devices for ion implantation, whose low capital and operation costs enable them to be used in cost-sensitive applications, and which enable the use of a far wider selection of substances to be implanted than prior art processes and equipment have allowed.

BRIEF DESCRIPTION OF THE INVENTION

Ion implantation devices according to this invention are based on pulsed power technology using vacuum spark gaps for producing ions from a solid surface. The ion source involves applying a pulsed high voltage to spark gaps formed between electrodes in a vacuum to produce a spark. The spark produces a plasma comprised of material from one of the electrodes, and this plasma tends to expand. Ions to be used for ion implantation are emitted from the edge of this plasma. One of the electrodes is a point electrode and the other is a surface electrode.

In one embodiment, for high current applications, a plurality of pairs of these electrodes can be arranged in an array in a magnetically insulated ion diode vastly to extend its range of available ion species. The ion source spark gaps ("spark source") are advantageously formed by a thin electrode (the point electrode) positioned across a gap from a surface electrode, which latter may be a flat or a curved surface. As many as eight of these spark gaps can conveniently be arrayed around the azimuth of the ion diode. A spark is struck simultaneously in all gaps, and plasma flows along the lines of the magnetic field. The dense plasma in the ion diode is composed mainly of material from the flat surface electrode. Extraction means is provided to extract the ions from the plasma cloud, and the ions are accelerated toward a target, in which they are implanted. Use of this technique allows operation of the diode without a physical anode surface, and in a mode where the source, rather than space charge, controls ion flow. This is appropriate for very high currents using electromagnets.

For medium current applications, a device using the same general principles can be built using a permanent magnet. The permanent magnet in this embodiment need not, and usually does not, serve to confine the plasma, but it does serve as extraction means by causing the development of secondary electrons which cause extraction of the ions. The permanent magnet suppresses currents of secondaries, and makes the use of an accelerating grid unnecessary. Grids can cause contamination.

Devices according to this inventions suppress electrons, utilizing criteria according to F. Winterberg. A useful source of these criteria can be found in the *Proceedings of the International School of Physics 'Enrico Fermi', course XLVII*, 1971, entitled "Physics of Hight Energy Density" pages 397–401. Disclosure is also made of Humphries, et al., U.S. Pat. No. 4,045,677, issued Aug. 30, 1977 relating to the generation of ion beams.

The above and other features of this invention can be fully understood from the following detailed description and the accompanying drawings, in which:

DETAILED DESCRIPTION OF THE INVENTION

Figure 1:
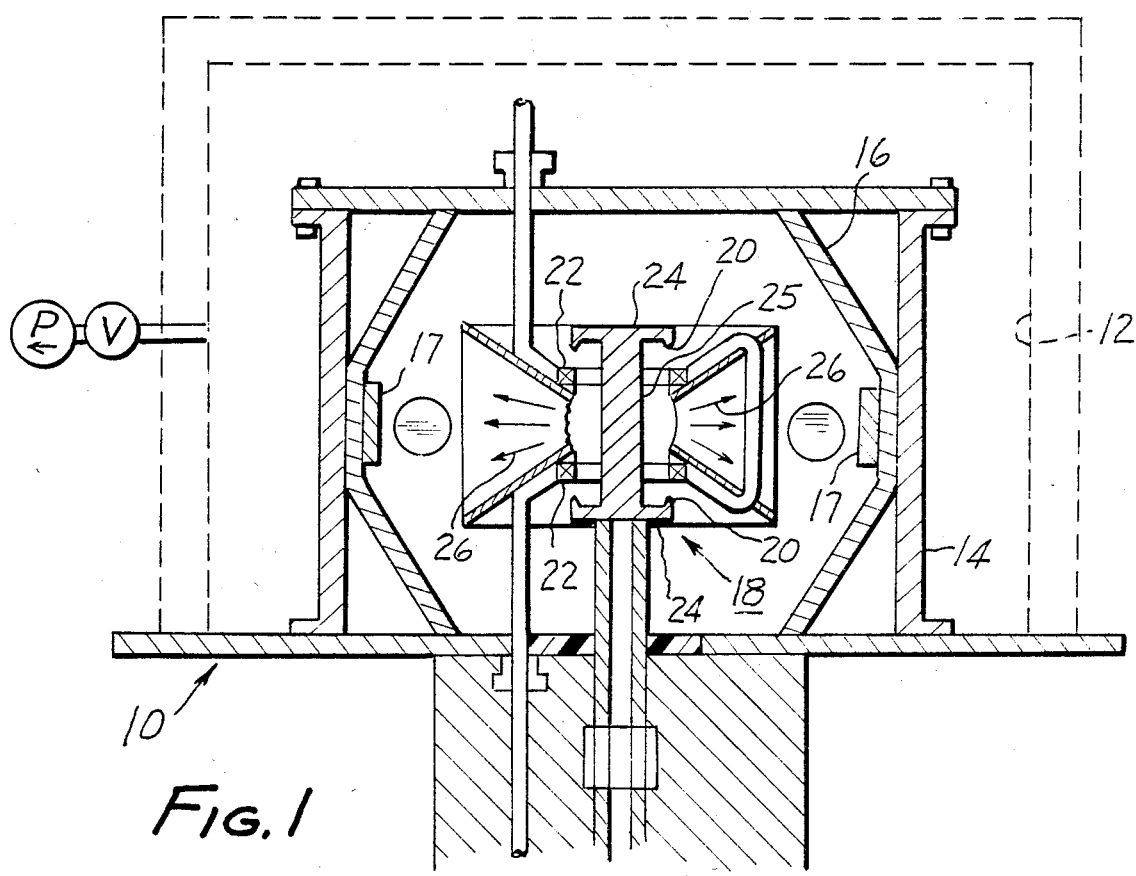
FIG. 1 is an axial cross-section, partly in cutaway cross-section, and partly in schematic rotation, showing the presently-preferred embodiment of the invention.
Figure 3:
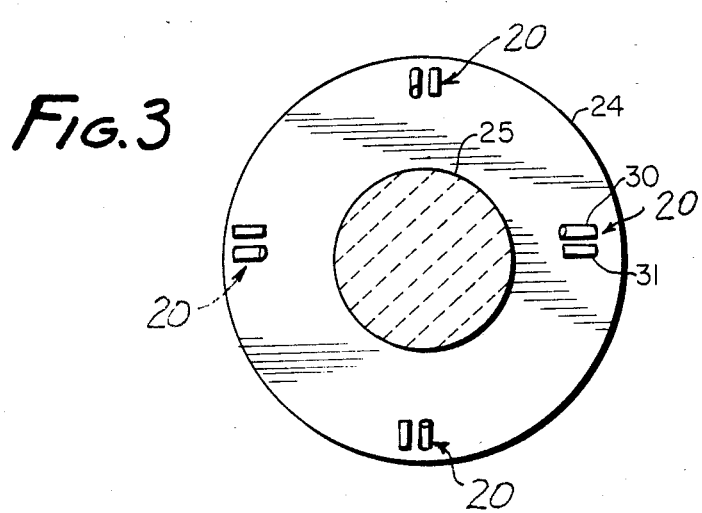
FIG. 3 is a partial cross-section taken at line 3—3 in FIG. 2.
Figure 7:
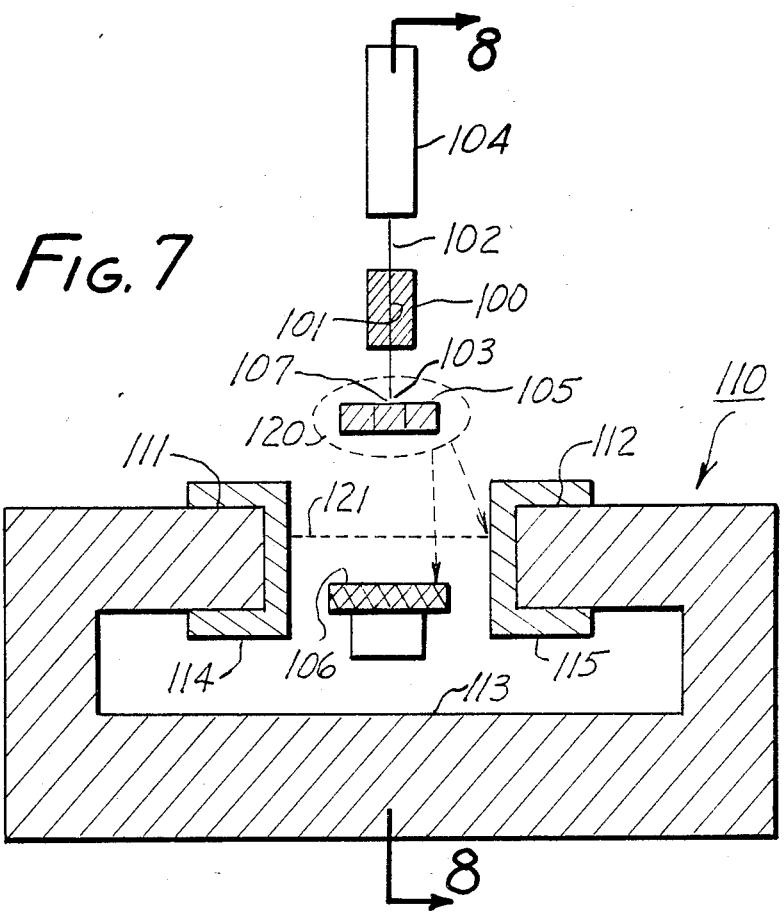
FIG. 7 is a top view of another embodiment of the invention.

This invention relates to a new type of magnetically insulated ion diode which importantly extends the range of useful ion species, and a new type of ion accelerating gap. With the ion source of the present invention, a large variety of ions can be produced from solid surfaces. The present invention may be utilized as an implanter, as illustrated in FIGS. 1 and 7.

A typical implanter according to the presently-preferred embodiment (FIG. 1) has a mechanical support 10 supporting an evacuable chamber 14 with a radiation shield 12. Chamber 14 encloses a target support 16 supporting targets 17 which will receive ions for implantation from magnetically insulated ion diode 18.

Figure 2:
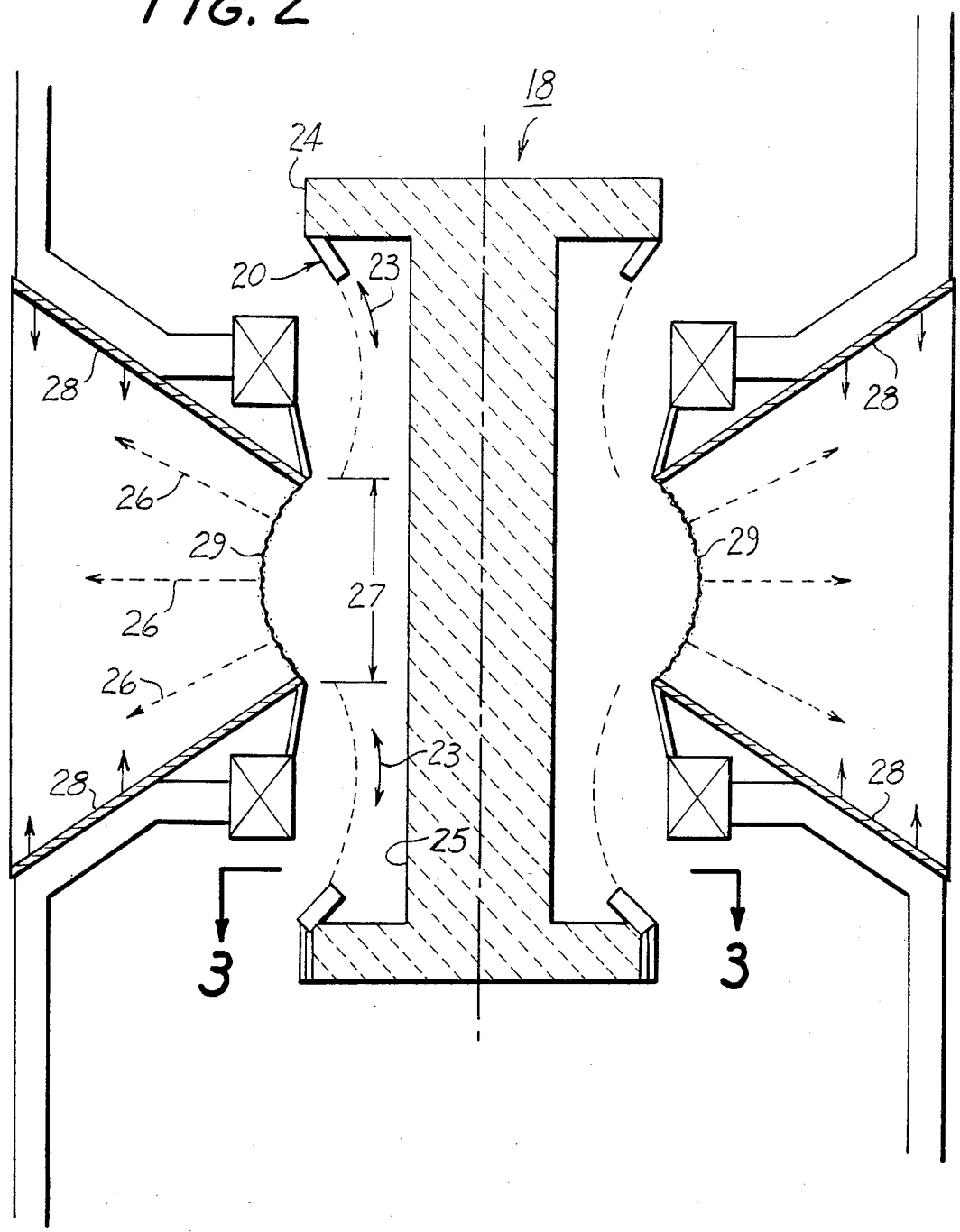
FIG. 2 is an enlarged view of a portion of FIG. 1.

Spark gaps 20 are positioned in the ion diode adjacent to coils 22. These coils, when energized become electomagnets to provide magnetic insulation for ions flowing in the drections generally indicated by arrows 23 (FIG. 2). The spark gaps will be described in detail later. Here it is sufficient to say that each comprises a pair of electrodes which pairs are mounted on respective flanges 24, which extend outwardly from a central stem 25. Flanges 24 and stem 25 form a "core" which is a ceramic insulator. In the illustrated embodiment, there are four spark gaps around the azimuth of each flange for a total of eight. Of course, there may be more or fewer, but this is a most convenient arrangement. Power is supplied to the electrodes of the spark gaps through conductors 38a and 38b. Application of sufficiently high voltages to these electrodes causes a spark between them, which spark erodes one of the electrodes and forms a plasma comprising the surface material of one of the electrodes. It is ions from this plasma which are to be accelerated in the general direction of arrows 26 that are to be implanted into the surface of the targets.

FIGS. 2, 3, 5 and 6 best illustrate the functioning of the spark gaps. When a spark is struck in the gap or gaps, plasma flows both in and out of the ion diode along lines 23 of the magnetic field produced as the consequence of energizing coils 22. Once the accelerating gap in the ion diode module, the region generally indicated by arrows 27, is filled with plasma, the inner module is pulsed to a high voltage. This is done by applying a positive voltage to the anode. Screen 29 is grounded. After an initial period during which some plasma is "cleared" from the ion diode, electrons will be confined by the magnetic field generated by coils 22, and ions are accelerated across the gap, through the grounded screen-like grid 29. This structure is sometimes referred to as "extraction means". The duration of the high voltage pulses are selected to end, before plasma build-up causes the high voltage to "short". It has been discovered that even very heavy ions from the spark gaps can be confined by relatively weak (approximately 500 Gauss) fields less than one inch (1") from the source. A pair of frustum shaped conductive metal vanes 28 provide a source of secondary electrons. The conductive vanes are for the creation of secondary electrons. Secondary electrons are generated to prevent the positive ions from seeing their own space charge. To avoid or limit contamination of the ion beam, the material of such vanes normally has one or more of the following characteristics: a low sputtering coefficient, or of the same material as the target, or are of the same material as the ionizing electrode.

The energizing of the spark gaps in this arrangement will allow source-limited ion flow. In this mode, the plasma which flows from the spark gaps along the magnetic field lines is substituted for a normal physical anode surface. The source plasma boundary position varies as ions are removed due to acceleration. Electrons are confined by the "mirror" magnetic field of the diode. These electrons act to increase the emitted ion current density through their own space charge.

An ion diode module is best shown in the cross-section in FIG. 2. The principal elements are the Helmhotz-type magnetic field coils 22, the vanes 28 which provide transverse electron neutralization, the cathode grid structure 29, and the anode structure 18.

Figure 4:
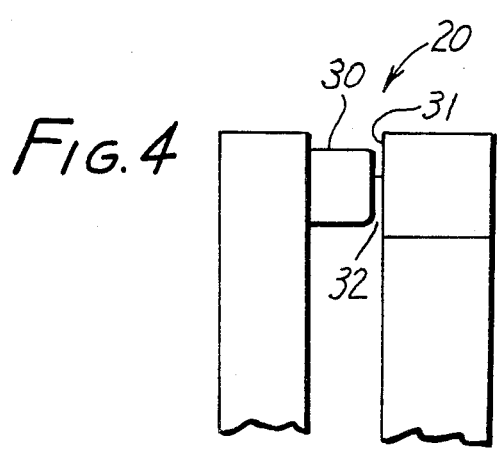
FIG. 4 is an enlarged side view of a portion of FIG. 2.

A typical ion source spark gap 20 is illustrated in FIGS. 2 and 4. Each spark source comprises a pair of electrodes between which a spark is to be formed. The electrodes are suitably mounted to the ceramic core, and are connected by appropriate conductors to a source potential, as will be described. Each pair of electrodes comprises a "point" electrode 30 (which is nominally the cathode), and a "surface electrode 31, which is nominally the anode, although its polarity does change in the operation of the device. A gap 32 where the spark is formed exists between the electrodes. The "pointed" electrode 30 is conveniently in the form of a thin metal foil whose edge is thin and relatively sharp. In this sense it is called a pointed electrode, even though its edge is a thin line with a substantial length. It could, instead, be pointed in the strict sense, but then certain advantages will not be realized. Surface electrode 31 may conveniently be flat, curved, or even round and rotatable. The purpose of this arrangement is to initiate a spark in the gap. Use of a thin metal foil cathode or some other shape having a thin or otherwise pointed edge or end configuration causes an electric field enhancement which lowers the voltage required for breakdown in the gap. Futhermore, by arraying the thin edge parallel to the surface, a long and random path for the spark to strike exists, thereby extending the life of the electrodes. By making the electrodes movable relative to each other—the surface electrode laterally relative to the edge, and the edge movable toward the surface electrode, a large erodable surface area exists, so that long runs can be enjoyed without replacing the electrodes. The spark generates a plasma containing ions of the species which forms the surface of the surface electrode. This surface can be the material of the entire electrode, or can be a sheath, or a coating. Very expensive materials can be coated onto a metal support, for example, and these materials will be produced as ions.

The power for the spark gap will be fed to the high voltage anode—normally pulsed to high voltage—by using eight separate ferrite isolation transformers T. Standard high voltage pulsed techniques will be used. All eight separate 2.7 nf capacitors C1 will be charged through 1 megohm (m$\Omega$) ballast resistors to a maximum of 30 kV. The exact charge voltage will be a variable depending on the ion species and the number of ions required. The grounds for all cables will float together during charging. Simultaneity of switching is assured by connecting the grounds together in common, and switching them from floating potential to true ground. The total ion source power requirement is 1.2 kW at 30 kV, for a total ion current of 40 mA. The point electrode can conveniently be made from stainless steel or from Be-Cu alloy.

The diode module is primarily a structure to support the spark sources and voltage, and if preferred it can be fabricated of stainless steel (the inner core) and a ceramic standoff. Cooling oil and half (in this case, four) of the spark source power cables will pass through the entire anode module. The others have a shorter length. The anode module is supported by a primary power feed structure, which is in turn connected to a secondary of an oil core transformer. The primary power is fed in through a ceramic oil/vacuum-high voltage interface. The cathode structure serves several purposes. It defines the electric fields, confines the diamagnetic magnetic field, and provides neutralizing electrons for ion beam propagation. Ion losses to the grid structure are minimized by using thin wires where possible. The cathode structure also must withstand significant heat loading due to ion bombardment. For the above reasons, a grid structure 29 of 0.25 tungsten wires spaced at approximately 1 cm intervals, and 1 mm wires at 45° intervals (corresponding to the spark sources) can be used. In the operation of the device, a high voltage is applied across each spark gap in a vacuum. This produces a vacuum spark, which creates a plasma made up of the material from one of the two electrodes, mostly from the surface electrode. The plasma cloud then begins to expand. The surface anode is initially the anode, but in the process it reverses and becomes the cathode. Ions are emitted from the edge of the plasma cloud in a space-charge limited flow mode, because the source is biased to some voltage +V. The grounded grid 29 defines the cathode, and the plasma is effectively the anode. Acceleration of high energy ions between the anode and cathode occurs until the voltage drops and the spark gaps are effectively shorted. This process can be rapidly repeated so that reasonable currents can be achieved.

Thus, the first pulse generates a cloud of ions, and the objective is now to eject them from the cloud toward the target. In FIGS. 1-6, this is done by pulsing the entire diode structure to a high positive voltage (the ion cloud being conductive). The grid will establish an electrostatic gradient across which the ions will eject toward the target. The magnetic field prevents electrons from crossing the gap, and the "magnetic bottle" resulting from the vertical variation in applied field prevents electrons from being lost (carrying current) out the "bottle" ends.

Figure 5:
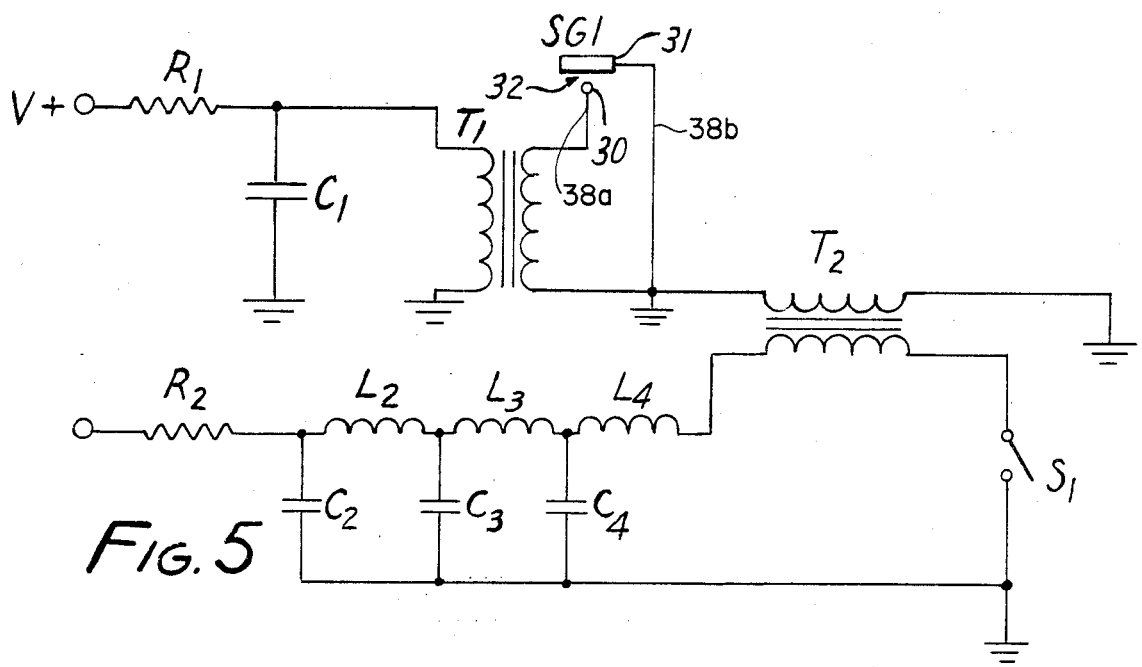
FIG. 5 is a circuit diagram showing circuitry for operating the device of FIG. 1.

A typical primary power source for each of the eight spark gaps is illustrated in FIG. 5. A high voltage pulse is applied to the primary of a high voltage transformer $T_1$. The secondary winding of transformer $T_1$ is biased by a voltage +V. Low inductance capacitor C1 and resistor $R_1$ are connected between the bias voltage and ground. With the circuit of FIG. 5, a dense plasma composed mainly of material from the flat or solid surface electrode 31 will be developed all along the edge of the point electrode 30 when switch S1 is energized.

The charge resistor $R_1$ limits current during a charge phase between pulses.

The accelerating circuit includes series LC circuits comprised of $L_2$, $L_3C_3$ and $L_4C_4$, T2, and S1. The series LC circuits permit variation of the primary pulse shape by varying L or C. For example, if $C_2$–$C_4$ are equal and $L_2=L_3=L_4$ there will be a pulse shape having a fixed voltage as the load current increases. Thus, with known plasma characteristics the voltage can be controlled.

Pulse shaping on the primary or low voltage side of the transformer T2 is simpler than on the secondary side. This transformer is a high voltage, high current transformer used in conjunction with the pulse shaping series LC circuits to form the desired pulse shape at low voltage for use at higher more useful voltages. Spark gap transformer $T_1$ permits formation of a separate pulse and transfer to the anode even though the relative ground $G_R$ is at high voltage. The acceleration high voltage is thus isolated from the spark source power.

The circuit is off between pulses allowing complete recovery to take place. Thus, if the system short circuits (i.e, acceleration causes the anode to short to gound) it recovers between pulses and is not shorted for the next pulse. This tolerance to short circuits permits the use of very dense plasmas which would disable DC circuits. Further, the short circuit tolerance allows much smaller anode to cathode gaps than with a DC plasma forming system.

Figure 6:
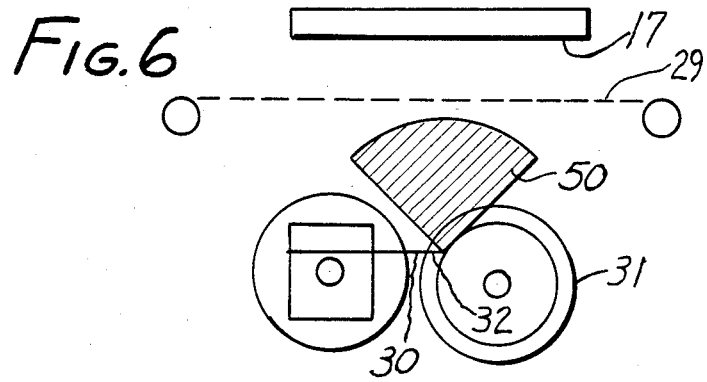
FIG. 6 is a schematic illustration of part of the construction of the spark gaps of FIG. 4.

The formation of a plasma "cone" from the gap is illustrated in FIG. 6. Point electrode 30 is considered a point or line electrode and electrode 31 is considered a surface electrode. In practice solid surface electrode 3 may simply be a bar or a cyclinder of metal spaced from or adjacent to the electrode 30.

The dense plasma produced by the sets of electrodes will be composed mainly of material from the surface electrode 31, and sparks will be formed with equal probability all over the electrode surface. A plasma "cone" 50 will expand from gap 20 toward grid 29. Ions from the end of cone 50 will be emitted toward the grid according to the space charge limited emission process due to the voltage +V. Because the plasma is expanding, the gap between plasma is expanding, the gap between plasma cone 50 and the grid decreases, and current rises as a function of time. The edge of the plasma cone 50 will be formed by emitted ions—in other words, ions are emitted preferentially where the plasma-grid gap is small. This process reduces ion density in this region. As long as voltage supplied by capacitor C1 is reasonably high, ions will be accelerated from the edge of the plasma at the area face of the cone. When the gap voltage produced by capacitor C1 falls, the process ends.

This process has been operated using a current extracted from the grid for C1 equal to 5 nanofarads (nf), V equal to 20 kV, and a distance between electrodes (i.e., the spark gaps) and grid of approximately two centimeters. At the 20 kV level, typical extracted current densities have been greater than 200 milliamps per square centimeter for an order of one microsecond (ms) and at least five square centimeters (cm2). Total average current was at least 10 microamps for a ten hertz repetition rate.

This process can be applied in a large number of ways. With a large number of sources each having a separate pulse power supply, ion implantation can be set up over a substantial area, for example, 1000 square centimeters. With such an implanter, a 1000 square centimeter implantation area could be used to implant steel with carbon to enhance wear resistance, to implant bearings, or to reduce corrosion resistance, depending on the ion used.

Figure 8:
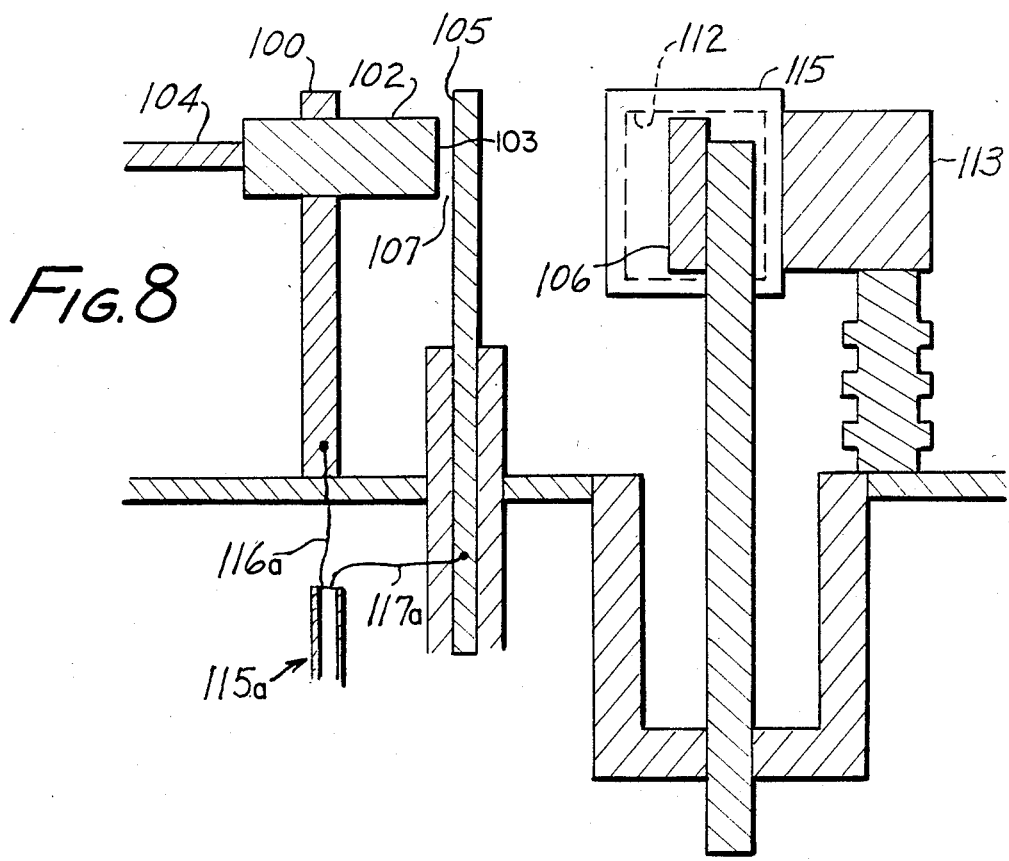
FIG. 8 is a partial axial section taken at line 8—8 in FIG. 7.

The embodiment of FIGS. 7 and 8 has much in common with the embodiment of FIGS. 1-6. As best shown in FIG. 7, an electrode holder 100 has a slit 101 therethrough in which there is fitted a long, plate-like "point" electrode 102 which has a sharp linear edge 103 in the same sense as in FIG. 1. A feed device 104 holds the point electrode, and is adapted to feed it toward a surface electrode 105.

Surface electrode 105 may, as before, be a plate, a bar, or a round rod. Preferably it will be a flat plate, and can act as a shield to discourage the particulates, which are also produced in the gap, from passage toward a target 106. A gap 107 is left between the electrodes. Because the surface electrode is eroded, the point electrode will be moved toward it from time to time, and if desired also from side to side.

A permanent magnet 110 is placed at the opposite side of the surface electrode from the spark gap. It has poles 111 and 112 connected by a bight 113 which are protected by metal pole protectors 114, 115, which protect the tips of the magnet from erosion and may themselves also be eroded to form ions to be implanted.

Target 106 is supported between the magnet poles, toward the edge farther from the electrodes.

The entire construction just described is appropriately supported and contained inside an evacuable structure. For the generation of a spark, and for the pulsing of the diode (the diode comprising in this case merely the two electrodes), connection to the diode can conveniently be made by means of a coaxial cable 115a one conductor 116a of which is connected to the point electrode through its support, and the other conductor 117a to the surface electrode 105 through its support (not shown). The pulsing circuitry is the same as that shown in FIG. 5, the surface electrode (initially positive) being connected to ground, and the point electrode to the secondary winding of the transformer. The target is connected to V(t).

The operation of the device of FIGS. 7 and 8 will now be described. This geometry is primarily intended for medium current pulsed ion implantation. As before, a voltage is applied between the electrodes, the surface electrode being initially biased, and the arc is struck when a pulsed positive voltage is applied to it. As before, the pointed electrode facilitates starting the spark. A cloud of ions, schematically shown by line 120 is developed and surrounds the surface anode. With the accelerating gap on the opposite side of the surface electrode from the target, microparticles (particulates) and neutral particles are discouraged from traveling toward the target (there is no line-of-sight path). They strike the electrode instead.

The potential of the permanent magnet remains at or near to V(t) because of the flow of secondary electron currents between the target and the pole tips. A substantial flow of secondary electrons is generated because of ion bombardment of the metal magnet tip protectors. They tend to flow from pole to pole as shown by line 121, and act as a cathode to define a V(t) potential surface, thus acting as a "grid". Secondary electrons are produced by ion bombardment of the magnet pole tips (or protectors). Purity is maintained by making the pole protectors from the same metal as is used for the surface anode. Ions which are sputtered off of the pole pieces will be projected toward the target and incorporated into the implanted layer by the ion beam mixing process.

At a fixed time after breakdown of the arc, a pulsed high voltage V(t) is applied to the target. The principal purpose of the magnetic field in this embodiment is to lengthen the path the secondary electrons take from target to ground. This increases the efficiency of the device.

Ions from the plasma source are directed toward the target by the electric field. Both embodiments employ a spark gap source, preferably with one electrode pointed, to develop a cloud of electrons. The ion source accelerating gap combination is sometimes called a "diode". Also, both embodiments have means to extract the ions from the cloud. In the embodiment of FIGS. 1-6 it is the grid. In the embodiment of FIGS. 7 and 8 it is the action of the magnetic pole pieces in developing a "grid" of secondary electrons.

In the embodiment of FIGS. 1-6, the effect of the magnetic field is to concentrate and direct the flow of ions in the cloud toward the central region, from which they are ejected. In both embodiments, the magnetic field suppresses electrons according to the principles of Winterberg.

Persons skilled in the art will recognize the elegant simplicity and economy of structure and operation of this device. Its performance equals and often exceeds that attainable with much more expensive apparatus.

This invention is not to be limited by the embodiments shown in the drawings and described in the description, which are given by way of example and not of limitation, but only in accordance with the scope of the appended claims.

I claim:

1. Ion source apparatus for providing ions to be used for implantation of said ions in a surface, said apparatus being adapted to be contained in an evacuable structure, said apparatus comprising:
    a spark gap comprising a pair of electrodes;
    means for energizing said electrodes to produce a plasma in a region around said gap from one of said electrodes;
    extraction means for extracting ions form said plasma whereby said extracted ions are available for use for ion implantation;
    magnetic means disposed and arranged to confine and magnetically insulate said plasma, and direct it toward said extraction means;
    pulsing means causing said first name means to energize said electrodes in time-spaced pulses; and
    pulsing means means to apply to said plasma an extraction potential relative to said extraction means in time-spaced pulses.

2. Apparatus according to claim 1 in which said extraction means comprises means for developing an electrostatic gradient to accelerate said ions from said plasma toward a target.

3. Apparatus according to claim 2 in which said extraction means compirses electro magnet means so disposed and arranged as to confine and magnetically to insulate said plasma, and to develop secondary electrons for the purpose of extracting said ions.

4. Apparatus according to claim 3 in which said extraction means further includes a screen through which said ions are accelerated.

5. Apparatus according to claim 2 in which said extraction means comprises a permanent magnet having a pair of poles disposed adjacent to said plasma region.

6. Apparatus according to claim 1 in which one of said electrodes is a point electrode, and the other electrode is a surface electrode, said point electrode having an edge or a point, and said surface electrode having a surface, said electrodes being adjustably spaced from one another, and said surface electrode having a surface adjacent to said point electrode made of a material which is to be implanted.

7. Apparatus according to claim 6 in which said point electrode has an edge which is thin and of substantial length extending generally parallel to said surface electrode.

8. Apparatus according to claim 6 in which said surface electrode is generally flat.

9. Apparatus according to claim 6 in which said surface electrode is generally curved.

10. Apparatus according to claim 9 in which said surface electrode is generally circular in cross-section and rotatable so as to confront said point electrode with a fresh surface.

11. Apparatus according to claim 3 in which a spool-like inner module has an axial central core and a pair of axially spaced-apart flanges, at least one of said spark gaps being disposed on each flange, said electromagnet means being disposed between and spaced from said flanges, and in which a conductive screen-like grid surrounds said central core.

12. Apparatus according to claim 11 in which a pair of metal frusto-conical vanes is disposed around said core, one on each side of said screen.

13. Apparatus according to claim 12 in which target-support means is disposed laterally from said core to hold a target in the path of electrons which pass through said grid.

14. Apparatus according to claim 2 in which said spark gap comprises a point electrode and a surface electrode, said electrodes being aligned with a support for a target, with the surface electrode between the target support and the point electrode, whereby to shield the target from particulates developed at the opposite side of the surface electrode, said target support being disposed between the poles of said magnet.

15. Apparatus according to claim 14 in which pole protectors cover said poles, said pole protectors being made of material to be implanted.

16. Apparatus according to claim 15 in which the point electrode is mounted for movement toward said surface electrode, and the electrodes are mounted for relative lateral movement.

17. A method for generating ions for ion implantation, comprising:

in a vacuum, utilizing a point electrode and a surface electrode which are spaced from one another to form a spark gap, energizing said spark gap in time-spaced pulses to form a spark that produces ions from the material of the surface electrode in a plasma around the gap, magnetically confining and insulating said plasma, and directing it toward extraction means; and applying an extractive potential to said plasma relative to said extraction means in time-spaced pulses, thereby to extract some of said ions from said plasma and directing them toward a target in which said ions are to be implanted.

18. A method according to claim 17 in which after said plasma has been generated, the spark gap and plasma are additionally energized, and in which an electrostatic gradient is provided adjacent to said plasma to assist in the extraction of the ions.

19. A method according to claim 18 in which an electromagnetic field is provided to insulate said plasma.

20. A method according to claim 19 in which a grid surrounds said plasma, which is biased to accelerate ions extracted from the plasma.

21. A method according to claim 18 in which said electrostatic gradient is created by secondary electrons flowing between two poles of a permanent magnet, between which poles a target is placed, and through which path the ions must pass.

22. A method according to claim 17 in which said electrodes are moved toward one another to maintain gap size and laterally relative to one another in order to erode a different electrode area.

* * * * *